(12) United States Patent
Shahani et al.

(10) Patent No.: US 9,379,469 B1
(45) Date of Patent: Jun. 28, 2016

(54) METHOD FOR ASSEMBLING A MULTIPLE LAYER ELECTRONIC ASSEMBLY

(71) Applicant: Lockheed Martin Corporation, Bethesda, MD (US)

(72) Inventors: Sunder Shahani, Jackson, NJ (US); John D. Santoro, Hatboro, PA (US); Kenneth M. Jackson, Jr., Westville, NJ (US); Kurt G. Presing, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 7 days.

(21) Appl. No.: 14/290,142

(22) Filed: May 29, 2014

(51) Int. Cl.
*H05K 3/30* (2006.01)
*H01R 12/91* (2011.01)
*H05K 3/10* (2006.01)

(52) U.S. Cl.
CPC .............. *H01R 12/91* (2013.01); *H05K 3/10* (2013.01); *H05K 2203/125* (2013.01); *Y10T 29/49139* (2015.01)

(58) Field of Classification Search
CPC ......... H05K 1/14; H05K 1/144; H05K 3/325; H05K 3/365; H05K 3/368; G02B 6/4214; Y10T 29/49126; Y10T 29/49128; Y10T 28/49147; Y10T 29/49165
USPC ........... 29/830, 831, 842, 846, 852; 361/736, 361/803; 439/65, 66, 91
See application file for complete search history.

(56) References Cited

U.S. PATENT DOCUMENTS

| | | | | |
|---|---|---|---|---|
| 5,045,975 | A * | 9/1991 | Cray | H01L 21/4853 29/838 |
| 6,183,272 | B1 * | 2/2001 | Muller | H01R 13/2414 439/66 |
| 7,333,683 | B2 * | 2/2008 | Sasaki | G02B 6/4214 257/E23.01 |
| 2013/0148322 | A1 * | 6/2013 | Fosnes | H05K 1/141 29/842 |

* cited by examiner

*Primary Examiner* — Donghai D Nguyen
(74) *Attorney, Agent, or Firm* — Withrow & Terranova, PLLC

(57) ABSTRACT

Mechanisms for aligning electrical contacts of electronic components in a multiple layer electronic assembly are disclosed. A mounting plate is configured to align multiple layers of the multiple layer electronic assembly. The mounting plate includes a surface that a plurality of first anchor features at first predetermined locations of the surface configured to anchor a plurality of first layer electronic assemblies with respect to the surface. The mounting plate also includes a plurality of second anchor features at second predetermined locations configured to anchor at least one second layer electronic assembly with respect to the plurality of first layer electronic assemblies.

7 Claims, 14 Drawing Sheets

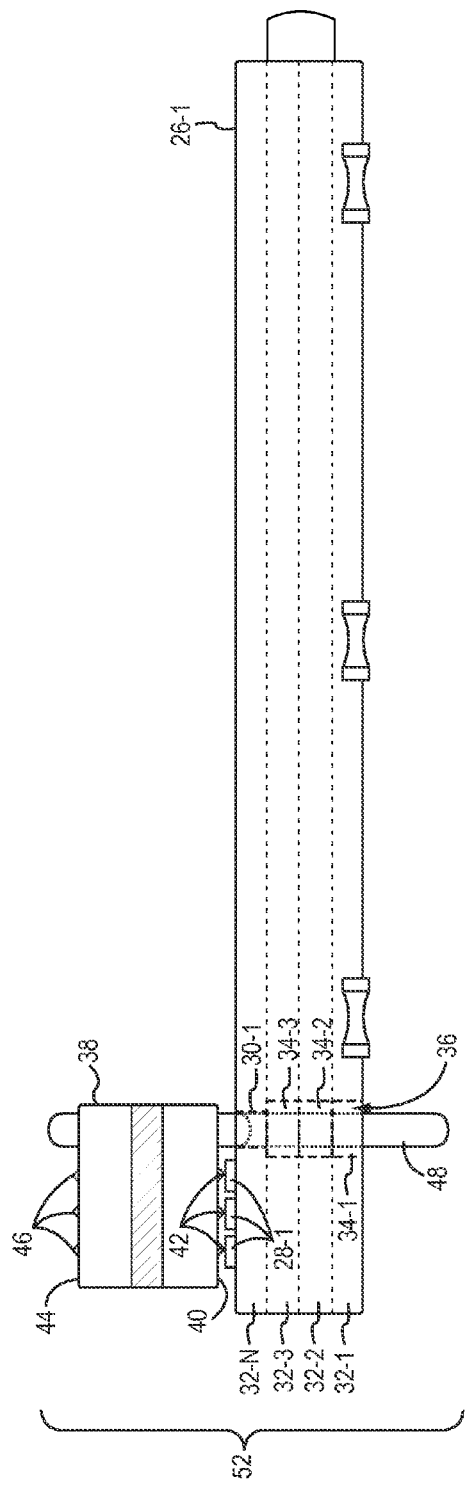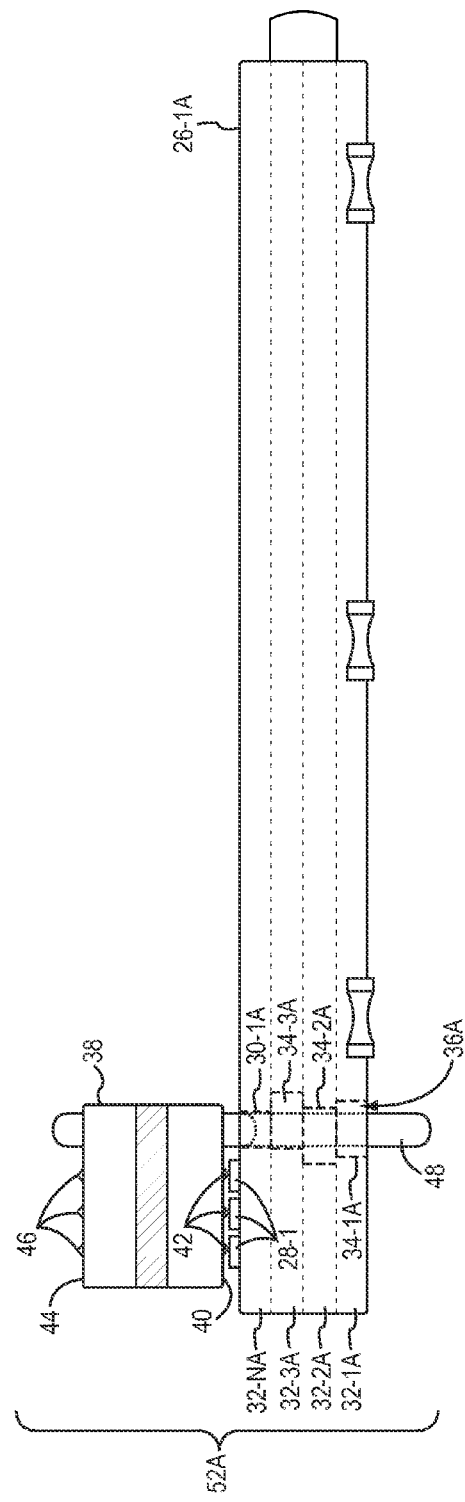
FIG. 8
FIG. 9

METHOD FOR ASSEMBLING A MULTIPLE LAYER ELECTRONIC ASSEMBLY

TECHNICAL FIELD

The embodiments relate generally to assembling layered electronic assemblies, and in particular to reducing or eliminating stacking tolerance problems in assembled layered electronic assemblies.

BACKGROUND

Electronic assemblies made up of multiple layers of electronic components in a horizontal or vertical stacked relationship with one another can result in relatively large differences in the locations of electrical contacts from one layer to another layer due to tolerance stacking issues. Specialized flexible interconnects that compensate for such differences are often utilized to interconnect the electrical contacts of components in one layer with the electrical contacts of components in an adjacent layer. Such specialized flexible interconnects can be relatively expensive, and often require relatively complicated and time-consuming assembly techniques, such as soldering minute electrical contacts to interconnect the components in the assembly.

Certain types of technologies, such as co-fired ceramic electronic components that comprise multiple ceramic layers, are inherently difficult to manufacture to precise tolerances. Electrical contacts on a face of each ceramic component may be at slightly different locations with respect to the edge of the ceramic components simply due to the manner in which ceramic components are manufactured, and thus, even though the ceramic components may be reliably placed in predetermined locations on a mounting surface, the precise location of the electrical contacts of such ceramic components may differ from component to component.

Tolerance stacking issues are exacerbated where a first layer in an electronic assembly is made up of multiple independent electronic components, and a second adjacent layer is a single unit that interconnects at multiple different locations with the multiple independent electronic components of the first layer. Deviation of any one of the independent electronic components in the first layer from a precise predetermined location can result in difficulties with lining up the electrical contacts of the two different layers.

SUMMARY

The embodiments relate to electronic components and assembly techniques that greatly reduce tolerance stacking deviations in layered electronic assemblies, and thereby facilitate the assembly of layered electronic assemblies using solderless connectors and blind mating techniques that reduce assembly complexity, assembly time, and costs, and increase reliability of the assembled layered electronic assembly.

In one embodiment a compression connector is provided. The compression connector includes a first contact face that includes a first plurality of electrically conductive first compressible contacts, and a second face that includes a second plurality of electrically conductive second compressible contacts. At least some of the second compressible contacts are in electrical communication with corresponding first compressible contacts. A pin extends substantially perpendicularly from a first surface of the compression connector. The length of the pin is sufficient to extend completely through an electronic component coupled to the first contact face and into an opening in a mounting plate.

In another embodiment, a mounting plate is provided. The mounting plate is configured to align multiple layers of a multiple layer electronic assembly. The mounting plate includes a surface that includes a plurality of first anchor features at first predetermined locations of the surface that are configured to anchor a plurality of first layer electronic assemblies with respect to the surface. In some embodiments, the first anchor features comprise openings configured to receive a pin of a compression connector. The mounting plate also includes a plurality of second anchor features at second predetermined locations that are configured to anchor at least one second layer electronic assembly with respect to the plurality of first layer electronic assemblies. In some embodiments, the second anchor features comprise pins that extend from the surface of the mounting plate.

In yet another embodiment, a monolithic electronic component is provided. The electronic component comprises a plurality of layers, and includes a plurality of electrical contact pads arranged in a predetermined pattern on a top surface of a top layer of the plurality of layers. The top layer forms a reference opening positioned in a predetermined location with respect to the plurality of electrical contact pads. The reference opening is in communication with openings in each layer of the plurality of layers to collectively form a through-hole through the electronic assembly.

In another embodiment a method of forming a monolithic co-fired electronic component is provided. A plurality of ceramic layers is generated, each ceramic layer including an opening having a first diameter. A top ceramic layer is generated. The top ceramic layer includes a plurality of electrical contact pads arranged in a predetermined pattern. The top ceramic layer forms a reference opening positioned in a predetermined location with respect to the plurality of electrical contact pads. The reference opening has a smaller diameter than the first diameter. The plurality of ceramic layers and the top ceramic layer are stacked together such that the reference opening and opening of each ceramic layer form a through-hole. The plurality of ceramic layers and the top ceramic layer are co-fired to form a monolithic co-fired electronic component.

In another embodiment, a method of assembling a layered electronic assembly is provided. A mounting plate having a surface comprising a plurality of anchor openings at first predetermined locations and at least two anchor pins at second predetermined locations is provided. For each of a plurality of first layer electronic components, a pin that extends substantially perpendicularly from a first contact face of a compression connector is inserted through a reference opening of a respective first layer electronic component of the plurality of first layer electronic components to form a subassembly. The pin extends completely through the first layer electronic component and has an extension portion that extends beyond a bottom surface of the first layer electronic component. The subassembly is mounted with respect to the mounting plate by inserting the extension portion in a corresponding anchor opening of the mounting plate. A second layer electronic assembly is mounted on top of the subassemblies by aligning two pin receiving openings in the second layer electronic assembly with the corresponding at least two anchor pins of the mounting plate and sliding the second layer electronic assembly down the at least two anchor pins on top of the plurality of subassemblies.

Those skilled in the art will appreciate the scope of the disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 8 is a block diagram illustrating a subassembly, according to one embodiment;

FIG. 9 is a block diagram illustrating a subassembly, according to another embodiment;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first layer" and "second first," and does not imply a priority, a type, an importance, or other attribute, unless otherwise stated herein. The term "about" used herein in conjunction with a numeric value means any value that is within a range of ten percent greater than or ten percent less than the numeric value.

The embodiments relate to electronic components and assembly techniques that greatly reduce tolerance stacking deviations in layered electronic assemblies, and thereby facilitate the assembly of layered electronic assemblies using solderless connectors and blind mating techniques that reduce assembly complexity, assembly time, and costs, and increase reliability of the assembled layered electronic assembly.

Figure 1:
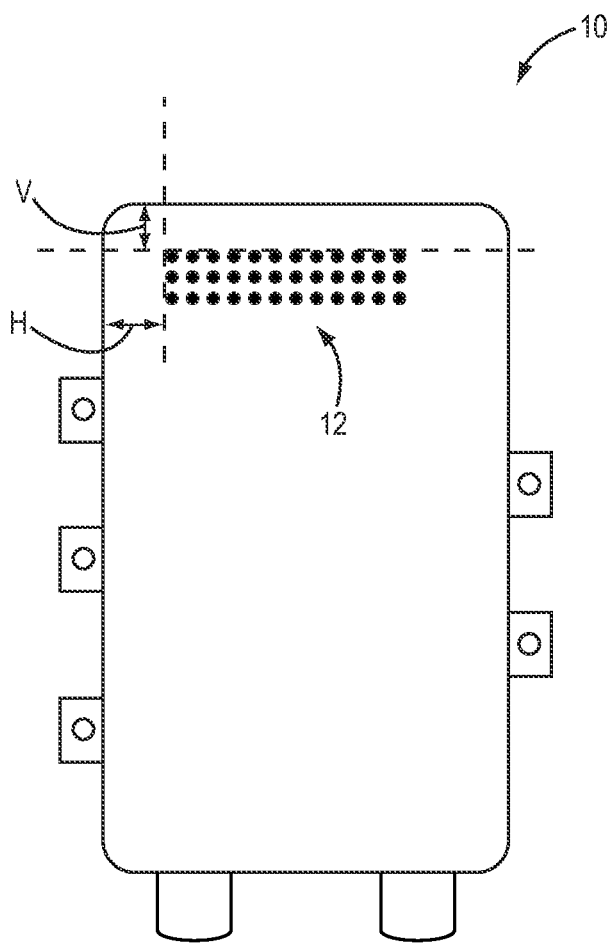
FIG. 1 is a block diagram illustrating a prior art electronic component.

FIG. 1 is a block diagram of a prior art electronic component 10. The electronic component 10 comprises a plurality of contacts 12, in this example, pins, which are used to facilitate communication between the electronic component 10 and other electronic components. Due to the nature of the technology used to manufacture the electronic component 10, and/or due to general manufacturing deficiencies, the precise location of the contacts 12 may slightly differ from one electronic component 10 to another electronic component 10 such that the distance V and/or distance H differ from one electronic component 10 to another electronic component 10. Some technologies, such as, by way of non-limiting example, co-fired ceramics, inherently make manufacturing electronic components to precise tolerances difficult or impossible.

Figure 2:
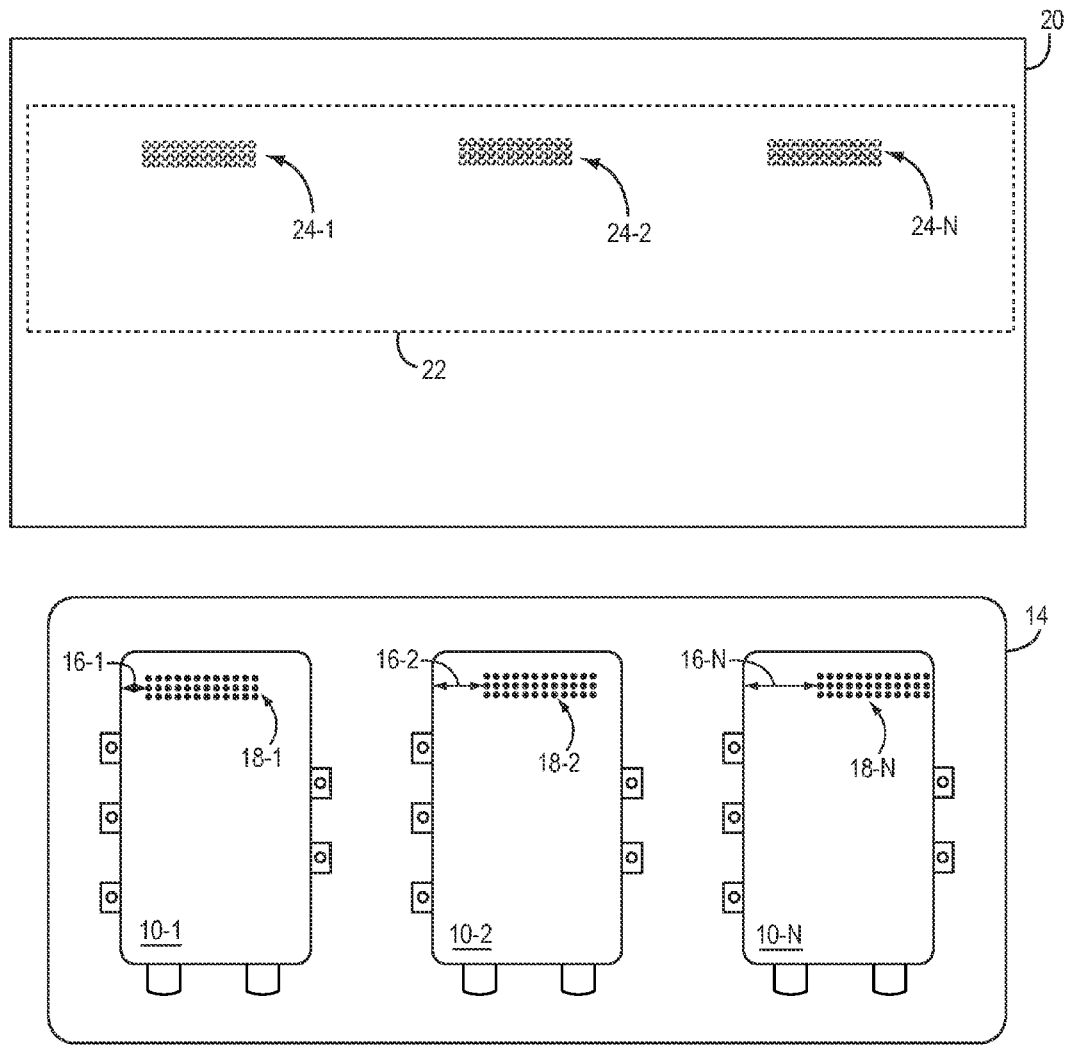
FIG. 2 is a block diagram illustrating two layers of electronic components that may be utilized to assemble a conventional layered electronic assembly.

FIG. 2 is a block diagram illustrating two layers of electronic components that may be utilized to assemble a conventional layered electronic assembly. A first layer of electronic components 10-1-10-N (generally, electronic components 10) are mounted with respect to a chassis, or a mounting plate 14. In the embodiment illustrated in FIG. 2, each of the electronic components 10 may provide a similar function that differs in some configurable characteristic, such as frequency or the like, such that the electronic components 10 are all obtained from the same manufacturer and have the same general form factor. In other embodiments, the electronic components 10 in the first layer may have different form factors. The mounting plate 14 may have bench features, such as guides or stops (not illustrated), which define predetermined locations at which the electronic components 10 are mounted with respect to the mounting plate 14. Despite having the same form factor, distances 16-1-16-N between respective sets 18-1-18-N of pins and the edges of the electronic components 10-1-10-N may all differ to due manufacturing processes, component technology, or the like.

An electronic assembly 20 contains one or more electronic components 22 that have matching sets 24-1-24-N of female contacts for interfacing with the sets 18-1-18-N of pins of the electronic components 10-1-10-N. The electronic assembly 20 and the one or more electronic components 22 may be manufactured to a relatively tight tolerance, such that the sets 24-1-24-N of female contacts are, from one electronic assembly 20 to another electronic assembly 20, at the same relative locations.

Figure 3:
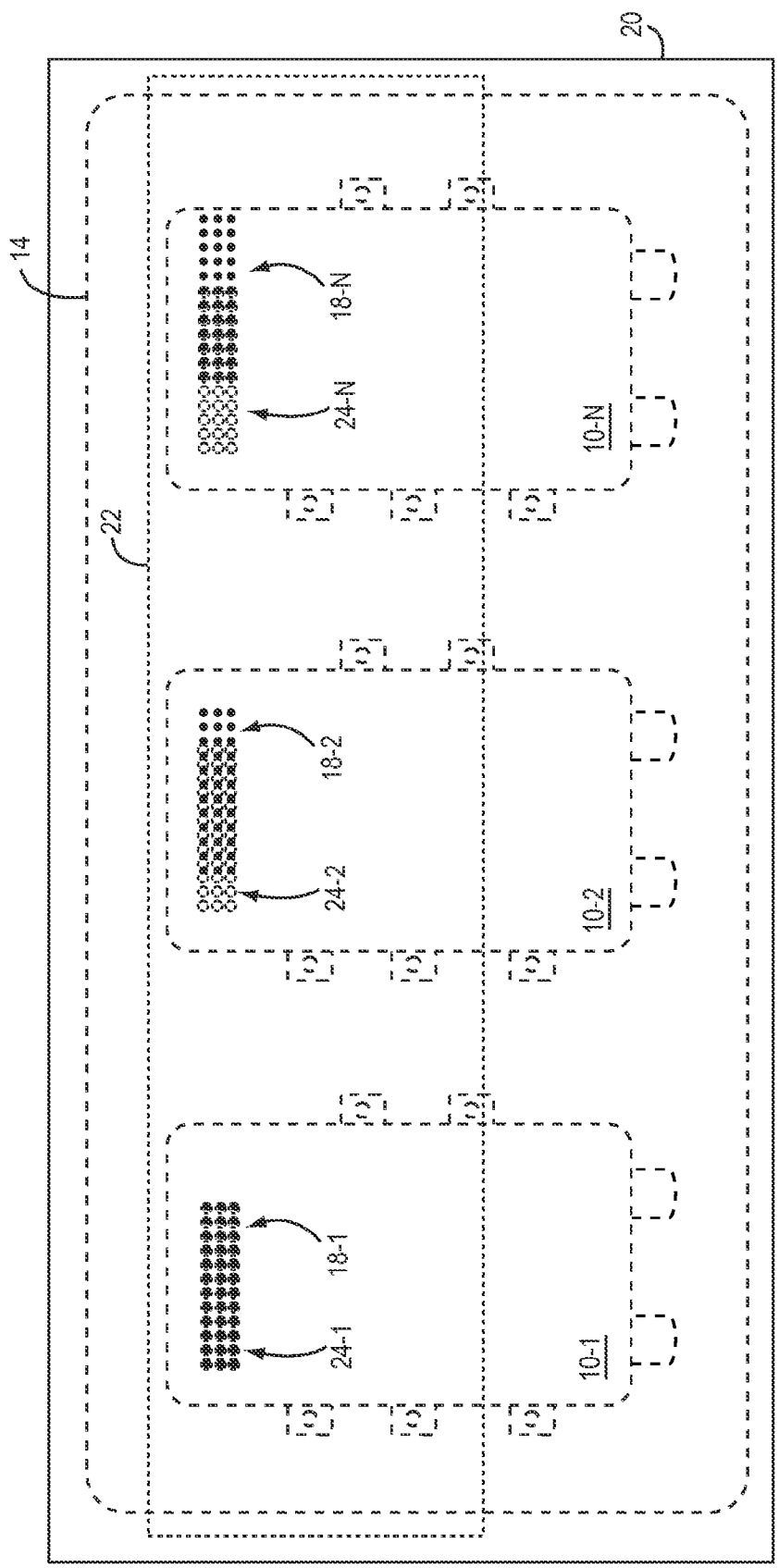
FIG. 3 is a block diagram illustrating a problem that arises when attempting to assemble a conventional layered electronic assembly.

FIG. 3 is a block diagram illustrating a problem that arises when attempting to assemble the electronic assembly 20 on top of the electronic components 10. Because the locations of the sets 18 of pins with respect to the edge of the respective electronic components 10 on which the sets 18 are located differ for each electronic component 10, the sets 24-1-24-N of female contacts of the electronic component 22 do not align with the sets 18 of pins. To compensate for this misalignment, flexible interface circuits (not illustrated) may be utilized to join each set 18 of pins with a corresponding set 24 of female contacts. Unfortunately, the use of such flexible interface circuits raises material costs, and greatly increases assembly time and assembly complexity. For example, each flexible interface circuit may require soldering to a corresponding set 18 of pins and/or a corresponding set 24 of female contacts.

Figure 4:
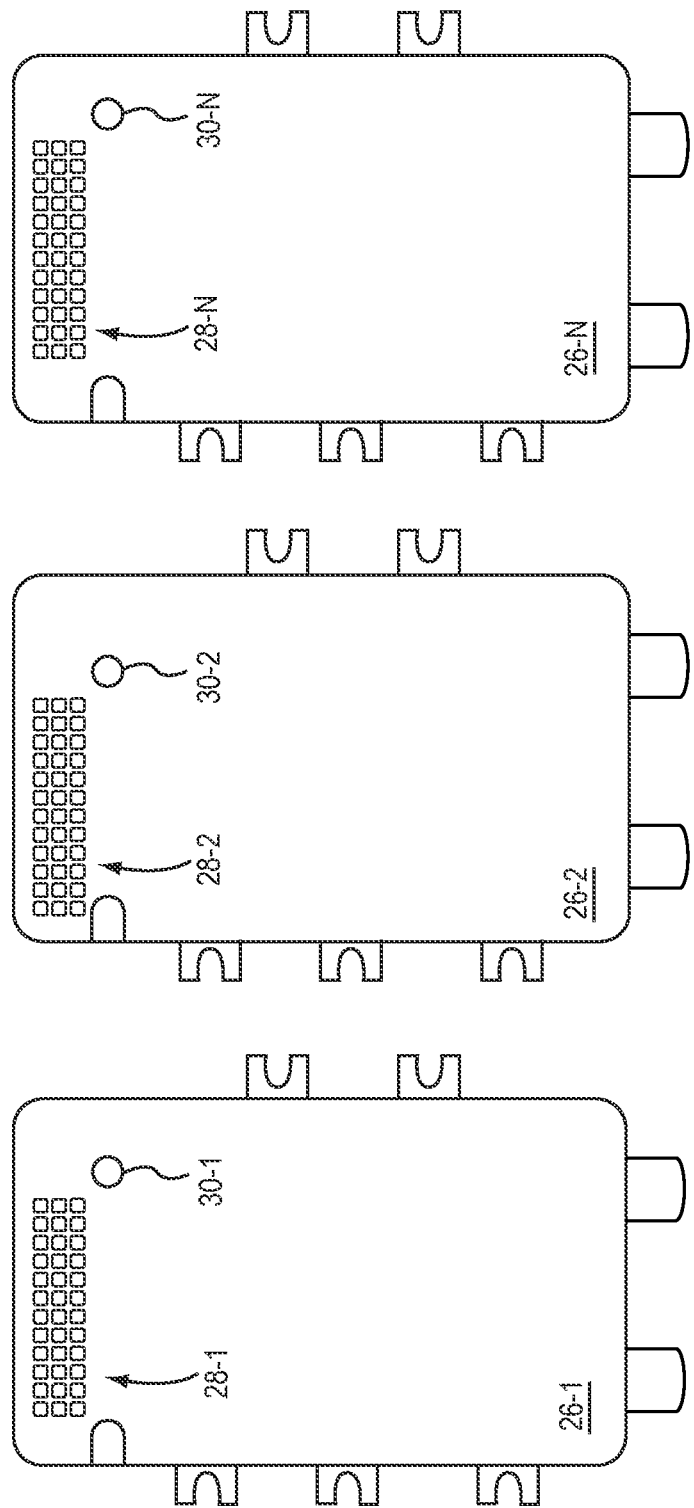
FIG. 4 is a block diagram illustrating a plurality of electronic components, according to one embodiment.

FIG. 4 is a block diagram illustrating a plurality of electronic components 26-1-26-N (generally, electronic components 26) according to one embodiment. The electronic components 26 are monolithic and, in one embodiment, formed from a plurality of layers of material, such as a ceramic-based material. In some embodiments, the electronic components 26 are formed using ceramic firing techniques. Each of the electronic components 26 has a corresponding set 28-1-28-N of electrical contact pads arranged in a predetermined pattern on a top layer of the respective electronic component 26. Each of the electronic components 26 also has a respective reference opening 30-1-30-N (generally, reference openings 30) that is positioned in a predetermined location with respect to a respective set 28-1-28-N of electrical contact pads. As will be discussed in greater detail herein, each reference opening 30 is in communication with openings in each lower layer of the respective electronic component 26 to collectively form a throughhole through the electronic component 26. Notably, although the nature of the manufacturing process may make it difficult to ensure a precise location of a set 28 of electrical contact pads with respect to an edge of a respective electronic component 26, the manufacturing process can ensure that features on any particular layer have precise tolerances with respect to one another. Thus, the precise location of each reference opening 30 with respect to the corresponding set 28 of contact pads is substantially identical for each electronic component 26. The electronic components 26 may implement any desired functionality, however, in one embodiment, the electronic components 26 comprise transmit/receive components utilized in a phased-array radar system.

Figure 5:
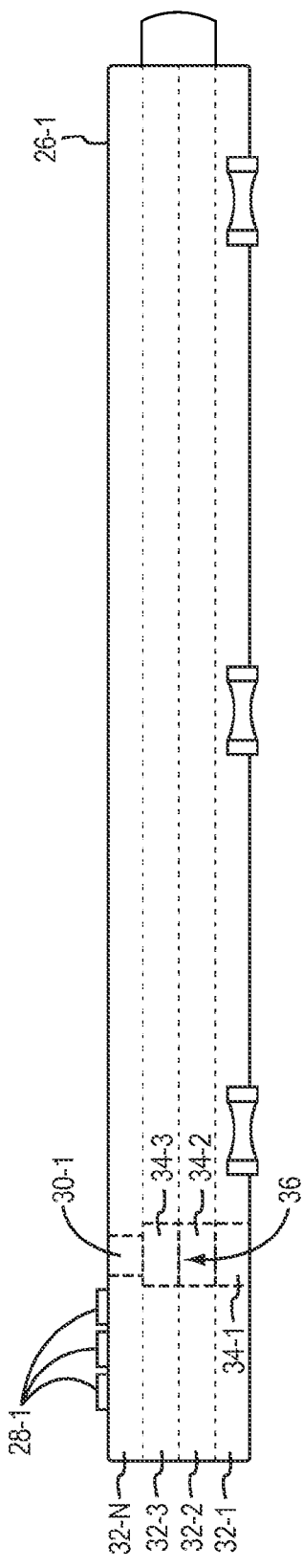
FIG. 5 is a block diagram illustrating a side view of the electronic component illustrated in FIG. 4, according to one embodiment.

FIG. 5 is a block diagram illustrating a side view of the electronic component 26-1 according to one embodiment. The electronic component 26-1 comprises a plurality of layers 32-1-32-N (generally, layers 32). In one embodiment, the electronic component 26-1 is a co-fired ceramic electronic component, and each layer 32 comprises a separate ceramic layer. Each layer 32-1-32-3 includes a corresponding opening 34-1-34-3, which, in conjunction with the reference opening 30-1, form a throughhole 36 that extends completely through the electronic component 26-1. In some embodiments, the openings 34 of each layer 32 are designed with a larger diameter than the reference opening 30-1 in the top layer 32-N so that if the location of the openings 34 deviate from one another, the throughhole 36 maintains a minimum diameter equal to that of the diameter of the reference opening 30-1. While for purposes of illustration only four layers 32 are illustrated, it should be apparent that the number of layers 32 may vary depending on the functionality of the electronic component 26-1, and thus the electronic component 26-1 may in some embodiments comprise fewer than four layers 32, or may comprise more than four layers 32.

In one embodiment, the electronic component 26-1 is formed by generating the plurality of ceramic layers 32-1-32-3 wherein each of the layers 32-1-32-3 has a respective opening 34-1-34-3 having a first diameter. The top layer 32-N is generated with the set 28-1 of electrical contact pads arranged in a predetermined pattern, and with the reference opening 30-1 positioned in a predetermined location with respect to the set 28-1 of contact pads. The reference opening 30-1 may have a smaller diameter than the first diameter. The layers 32-1-32-N may be stacked together, and co-fired to form the monolithic electronic component 26-1.

Figure 6:
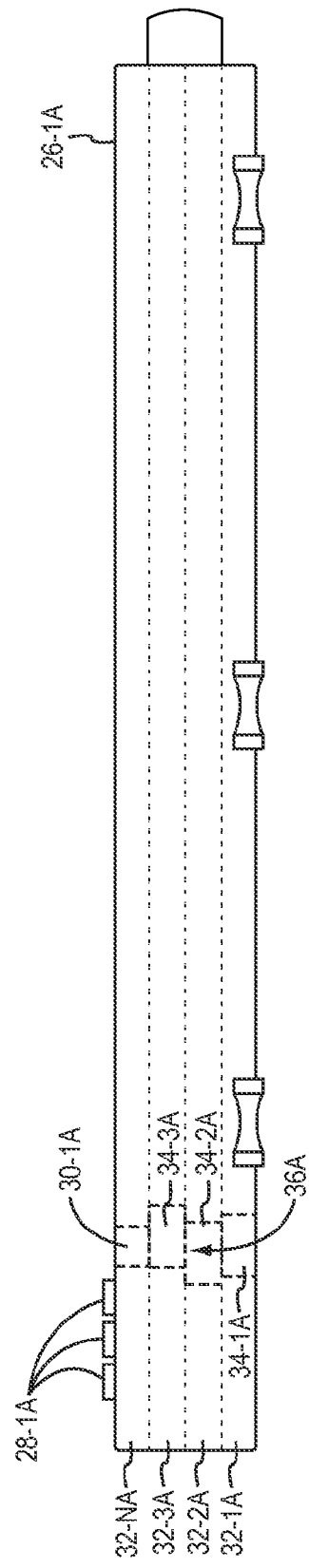
FIG. 6 is a block diagram illustrating a side view of an electronic component, according to another embodiment.

FIG. 6 is a block diagram illustrating an electronic component 26-1A, which is substantially similar to the electronic component 26-1, except due to the manufacturing process, openings 34-1A-34-3A in layers 32-1A-32-3A shifted position slightly with respect to one another. However, because each of the openings 34-1A-34-3A has a larger diameter than the diameter of a reference opening 30-1A in a top layer 32-NA, a throughhole 36A that extends completely through the electronic component 26-1A has a minimum diameter equal to the diameter of the reference opening 30-1A.

Figure 7A:
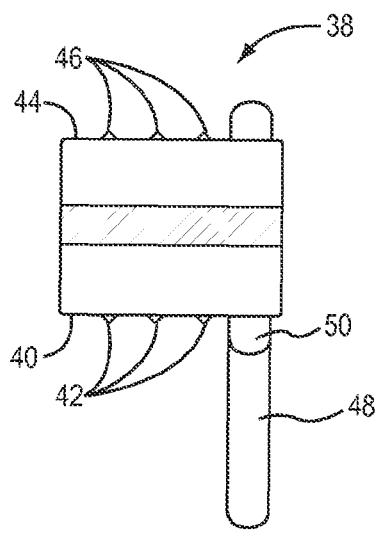
FIGS. 7A-7C are block diagrams that illustrate a compression connector, according to one embodiment.
Figure 7B:
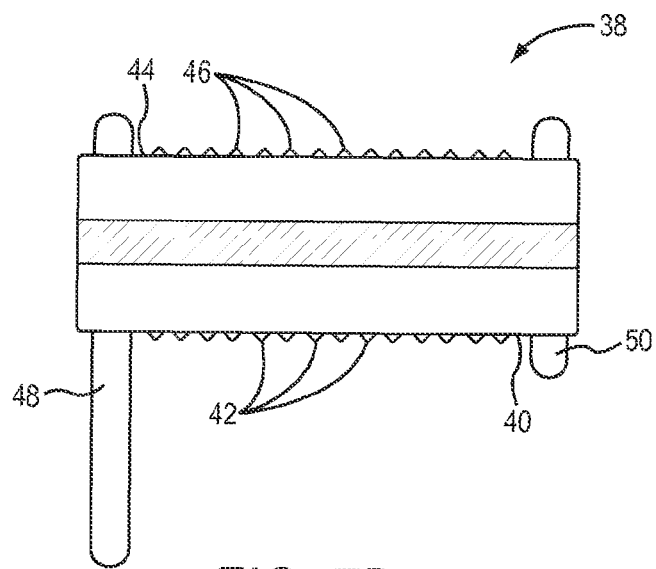
Figure 7C:
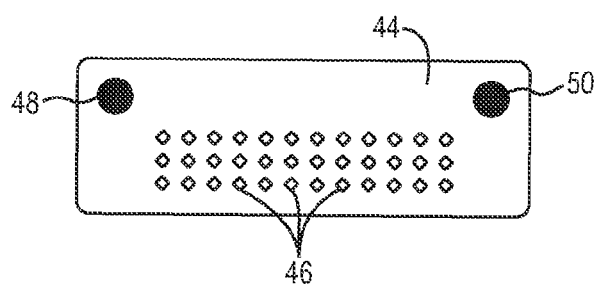

FIG. 7A-7C are block diagrams that illustrate a compression connector 38 according to one embodiment. FIG. 7A is a block diagram of an end view of the compression connector 38, according to one embodiment. The compression connector 38 includes a first contact face 40 on which a plurality of electrically conductive first contacts 42 (hereinafter "first contacts 42") are disposed. The first contacts 42 may comprise springs, and be compressible, such that pressure on a first contact 42 in a direction toward the first contact face 40 urges the first contact 42 toward the first contact face 40.

In one embodiment, the first contacts 42 are in a same predetermined pattern as that of a set 28 of electrical contact pads of an electronic component 26. The compression connector 38 also includes a second contact face 44 on which a plurality of electrically conductive second contacts 46 (hereinafter "second contacts 46") are disposed. The second contacts 46 may also comprise springs, and be compressible, such that pressure on a second contact 46 in a direction toward the second contact face 44 urges the second contact 46 toward the second contact face 44. At least some of the second contacts 46 are in electrical communication with corresponding first contacts 42, such that electrical signals may be communicated from a first contact 42 to a second contact 46, and vice versa.

The compression connector 38 includes a pin 48 that extends substantially perpendicularly from the first contact face 40. As will be discussed in greater detail herein, the pin 48 extends a distance that is sufficient to extend completely through the electronic component 26 and extend beyond the bottom surface of the electronic component 26. The pin 48 is in a predetermined location with respect to the first contacts 42 on the first contact face 40. In some embodiments, the pin 48 may extend above the second contact face 44. In one embodiment, the compression connector 38 includes a pin 50 that extends a lesser amount from the first contact face 40 than that of the pin 48.

FIG. 7B is a block diagram of a side view of the compression connector 38, according to one embodiment. FIG. 7C is a block diagram of a top view of the compression connector 38, according to one embodiment.

In one embodiment, during assembly of a multiple layered electronic assembly, each electronic component 26 is coupled to a compression connector 38 to form a subassembly prior to mounting the subassembly to a mounting plate 14 or other surface. FIG. 8 is a block diagram of a subassembly 52 according to one embodiment. The subassembly 52 comprises the compression connector 38 illustrated in FIGS. 7A-7C and the electronic component 26-1 illustrated in FIG. 5. To assemble the subassembly 52, the pin 48 is inserted into the throughhole 36 formed by the reference opening 30-1 and openings 34-1-34-3. The reference opening 30-1 is in a predetermined location with respect to the set 28-1 of contact pads. The pin 48 is also in a same predetermined location with respect to the first contacts 42. Insertion of the pin 48 into the throughhole 36 thus precisely aligns the first contacts 42 with the set 28 of contact pads, irrespective of the precise location of the set 28 of contact pads on the surface of the layer 32-N of the electronic component 26-1.

FIG. 9 is a block diagram of a subassembly 52A according to another embodiment. The subassembly 52A comprises the compression connector 38 illustrated in FIGS. 7A-7C and the electronic component 26-1A illustrated in FIG. 6. To assemble the subassembly 52A, the pin 48 is inserted into the throughhole 36A formed by the reference opening 30-1A and openings 34-1A-34-3A. The reference opening 30-1A is in a predetermined location with respect to the set 28-1 of contact pads. The pin 48 is also in a same predetermined location with respect to the first contacts 42. Insertion of the pin 48 into the throughhole 36A thus precisely aligns the first contacts 42 with the set 28-1 of contact pads, irrespective of the precise location of the set 28-1 of contact pads on the surface of the layer 32-NA of the electronic component 26-1A. Even though the openings 34-1A-34-3A are not aligned with one another, the larger diameter of the openings 34-1A-34-3A with respect to the diameter of the reference opening 30-1A ensures that a minimum diameter of the throughhole 36A allows passage of the pin 48 completely through the throughhole 36A.

Figure 10:
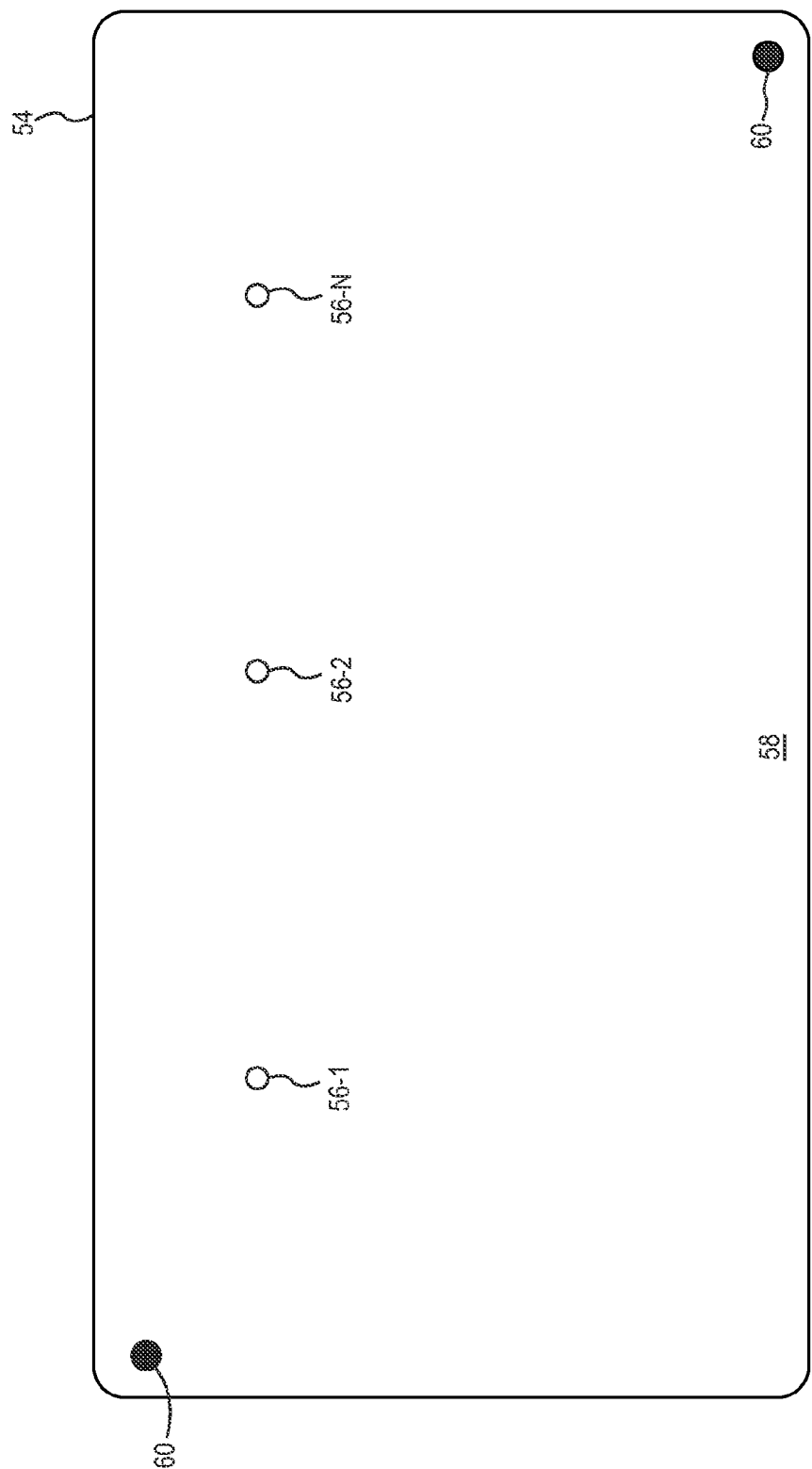
FIG. 10 is block diagram illustrating a mounting plate, according to one embodiment.

FIG. 10 is block diagram of a mounting plate 54, according to one embodiment. The mounting plate 54 may comprise any suitable surface on which components, such as the electronic components 26, may be mounted. By way of non-limiting examples, the mounting plate 54 may comprise a chassis, and/or a cold plate configured to remove heat via conduction from the electronic components 26. The mounting plate 54 includes a plurality of first anchor features 56-1-56-N (generally, first anchor features 56) at corresponding predetermined locations on a surface 58. As discussed in greater detail herein, the first anchor features 56 are configured to anchor a plurality of electronic components 26 with respect to the surface 58. In one embodiment, the first anchor features 56 comprise openings having a diameter configured to snugly receive the pin 48 of a compression connector 38. The openings may be formed by a continuous, non-threaded surface. The mounting plate 54 is preferably made of a material that facilitates precise manufacturing tolerances of features such as the first anchor features 56. In one embodiment, the mounting plate 54 comprises aluminum.

The mounting plate 54 also includes at least two second anchor features 60 that are configured to anchor at least one second layer electronic assembly with respect to the first anchor features 56. In one embodiment, the second anchor features 60 comprise pins that extend substantially perpendicularly from the surface 58 and to a height above the electronic components 26 when mounted to the surface 58.

Figure 11:
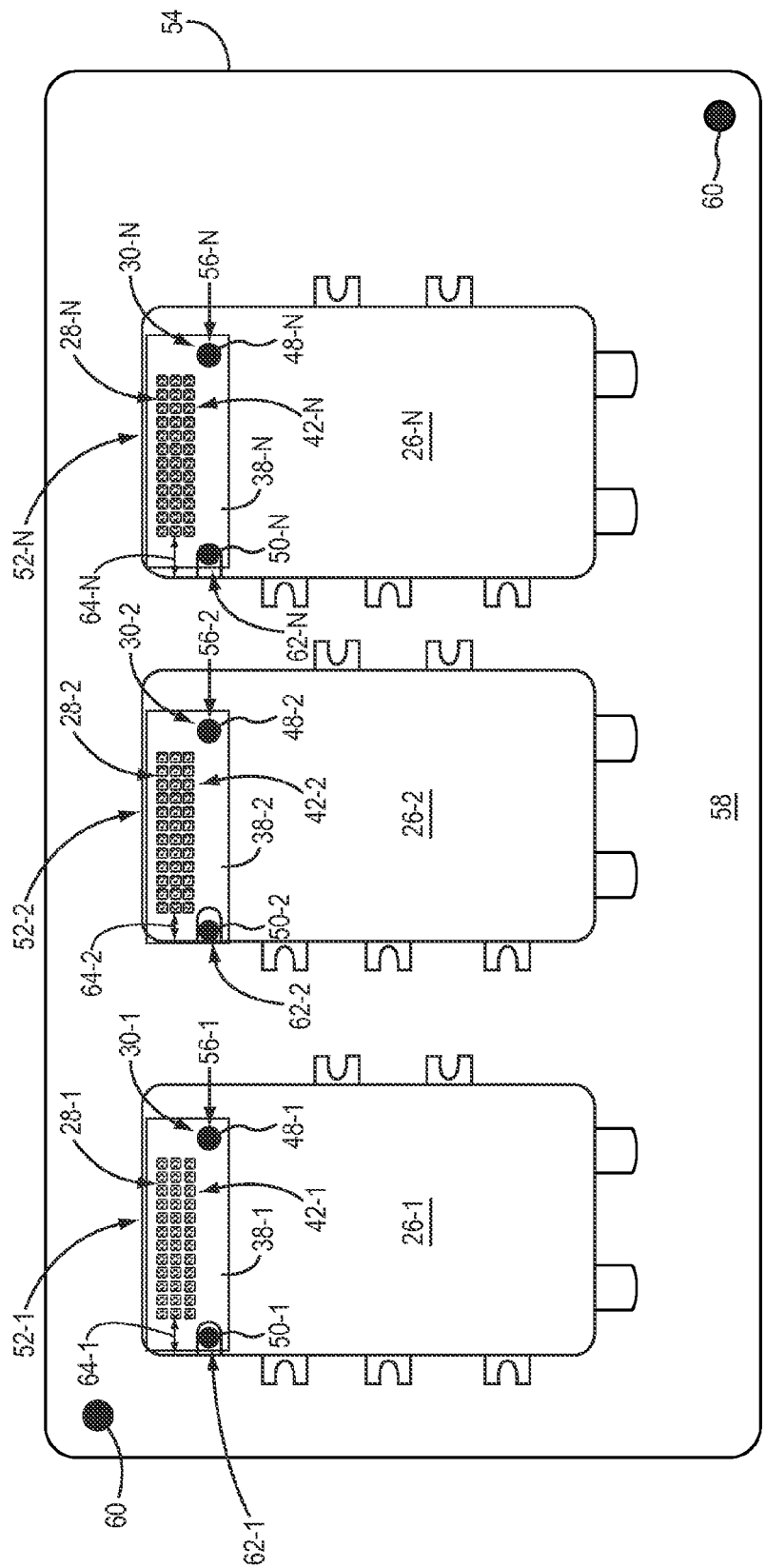
FIG. 11 is a block diagram illustrating a top view of a plurality of subassemblies mounted with respect to a surface of a mounting plate, according to one embodiment.

FIG. 11 is a block diagram illustrating a top view of a plurality of subassemblies 52 mounted with respect to the surface 58 of the mounting plate 54. A subassembly 52-1 comprises the electronic component 26-1 and a compression connector 38-1. The subassembly 52-1 was formed by inserting a pin 48-1 of the compression connector 38-1 into a reference opening 30-1 of the electronic component 26-1. Because the reference opening 30-1 is in a predetermined location with respect to the set 28-1 of contact pads, and the pin 48-1 is also in a same predetermined location with respect to first contacts 42-1, insertion of the pin 48-1 into the reference opening 30-1 precisely aligns the first contacts 42-1 with the set 28-1 of contact pads of the electronic component 26-1, irrespective of the precise location of the set 28-1 of contact pads on the surface of the electronic component 26-1. During assembly of the subassembly 52-1, a pin 50-1 of the compression connector 38-1 may be inserted into a groove 62-1 formed in the surface of the electronic component 26-1 to prevent rotational movement of the compression connector 38-1 with respect to the electronic component 26-1.

A subassembly 52-2 comprises the electronic component 26-2 and a compression connector 38-2. The subassembly 52-2 was formed by inserting a pin 48-2 of the compression connector 38-2 into a reference opening 30-2 of the electronic component 26-2. Because the reference opening 30-2 is in a predetermined location with respect to the set 28-2 of contact pads, and the pin 48-2 is also in a same predetermined location with respect to first contacts 42-2, insertion of the pin 48-2 into the reference opening 30-2 precisely aligns the first contacts 42-2 with the set 28-2 of contact pads of the electronic component 26-2, irrespective of the precise location of the set 28-2 of contact pads on the surface of the electronic component 26-2. During assembly of the subassembly 52-2, a pin 50-2 of the compression connector 38-2 may be inserted into a groove 62-2 formed in the surface of the electronic component 26-2 to prevent rotational movement of the compression connector 38-2 with respect to the electronic component 26-2.

A subassembly 52-N comprises the electronic component 26-N and a compression connector 38-N. The subassembly 52-N was formed by inserting a pin 48-N of the compression connector 38-N into a reference opening 30-N of the electronic component 26-N. Because the reference opening 30-N is in a predetermined location with respect to the set 28-N of contact pads, and the pin 48-N is also in a same predetermined location with respect to first contacts 42-N, insertion of the pin 48-N into the reference opening 30-N precisely aligns the first contacts 42-N with the set 28-N of contact pads of the electronic component 26-N, irrespective of the precise location of the set 28-N of contact pads on the surface of the electronic component 26-N. During assembly of the subassembly 52-N, a pin 50-N of the compression connector 38-N may be inserted into a groove 62-N formed in the surface of the electronic component 26-N to prevent rotational movement of the compression connector 38-N with respect to the electronic component 26-N.

While for purposes of illustration only three electronic components 26 are shown as being mounted with respect to the surface 58 of the mounting plate 54, the embodiments are not so limited, and any number of electronic components 26 may be mounted with respect to the surface 58 of the mounting plate 54.

Notably, even though the distances 64-1, 64-2 and 64-N between the respective sets 28 of contact pads of the electronic components 26 and the edges of the respective electronic components 26 all differ, because each reference opening 30 is in a same predetermined location with respect to the set 28 of contact pads of the respective electronic component 26, as long as each reference opening 30 is anchored to a respective first anchor feature 56 with a corresponding pin 48 of a compression connector 38, the sets 28 of contact pads of the electronic components 26 will each be at a predetermined location with respect to the surface 58.

Figure 12:
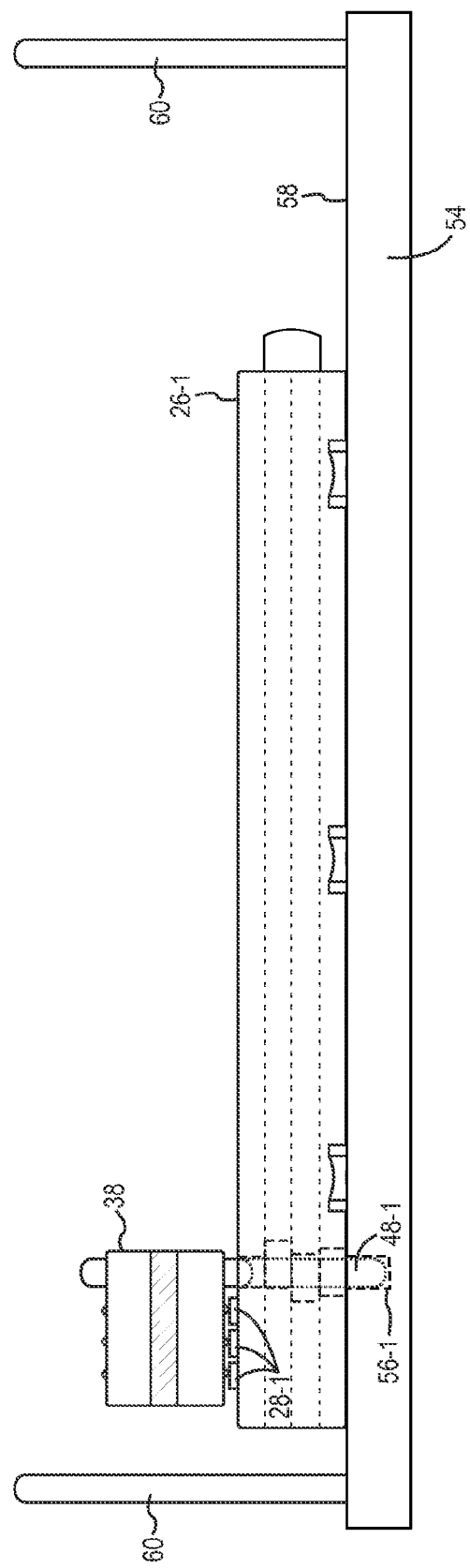
FIG. 12 is a block diagram illustrating a side view of the plurality of subassemblies mounted with respect to the surface of the mounting plate illustrated in FIG. 11.

FIG. 12 is a block diagram of a side view illustrating the plurality of subassemblies 52 mounted with respect to the surface 58 of the mounting plate 54.

Figure 13:
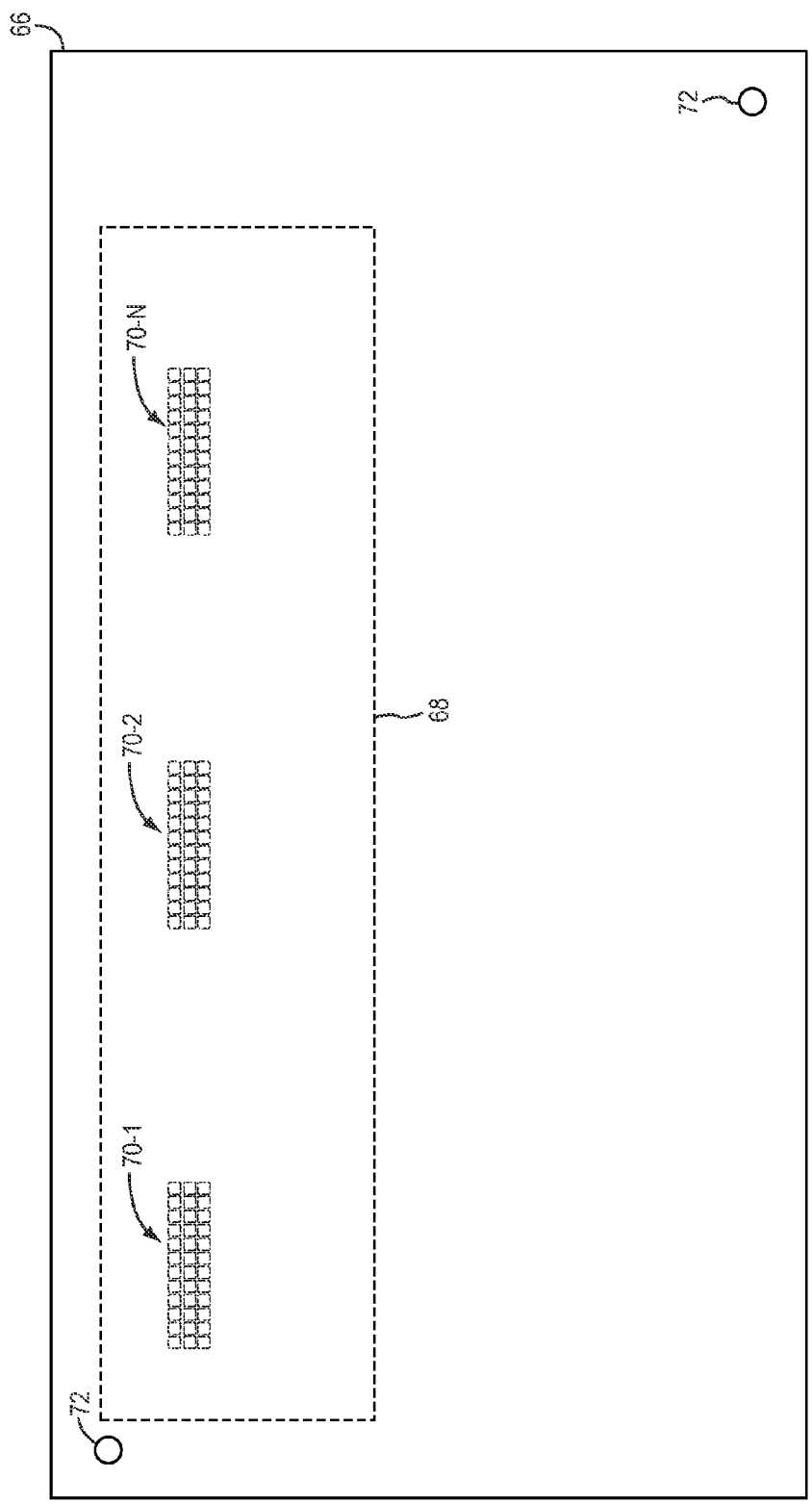
FIG. 13 is a block diagram illustrating a top view of a second layer electronic assembly, according to one embodiment.

FIG. 13 is a block diagram illustrating a top view of a second layer electronic assembly 66 according to one embodiment. The second layer electronic assembly 66 includes one or more electronic components 68 that are mounted to an underside of the second layer electronic assembly 66. In this example, for purposes of illustration only, a single electronic component 68 is illustrated, but the second layer electronic assembly 66 may comprise any number of electronic components 68. The electronic component 68 includes a plurality of sets 70-1-70-N of contact pads that are configured to be directly electrically coupled to the sets 28-1-28-N of contact pads of the electronic components 26-1-26-N. While the second layer electronic assembly 66 may implement any desired functionality, in one embodiment the second layer electronic assembly 66 comprises direct current power and logic assemblies for use with transmit and receive components in a phased array radar system.

The second layer electronic assembly 66 includes pin receiving openings 72 that are configured to receive corresponding second anchor features 60 of the mounting plate 54. The pin receiving openings 72 are located in predetermined locations with respect to the sets 70-1-70-N of contact pads.

Figure 14:
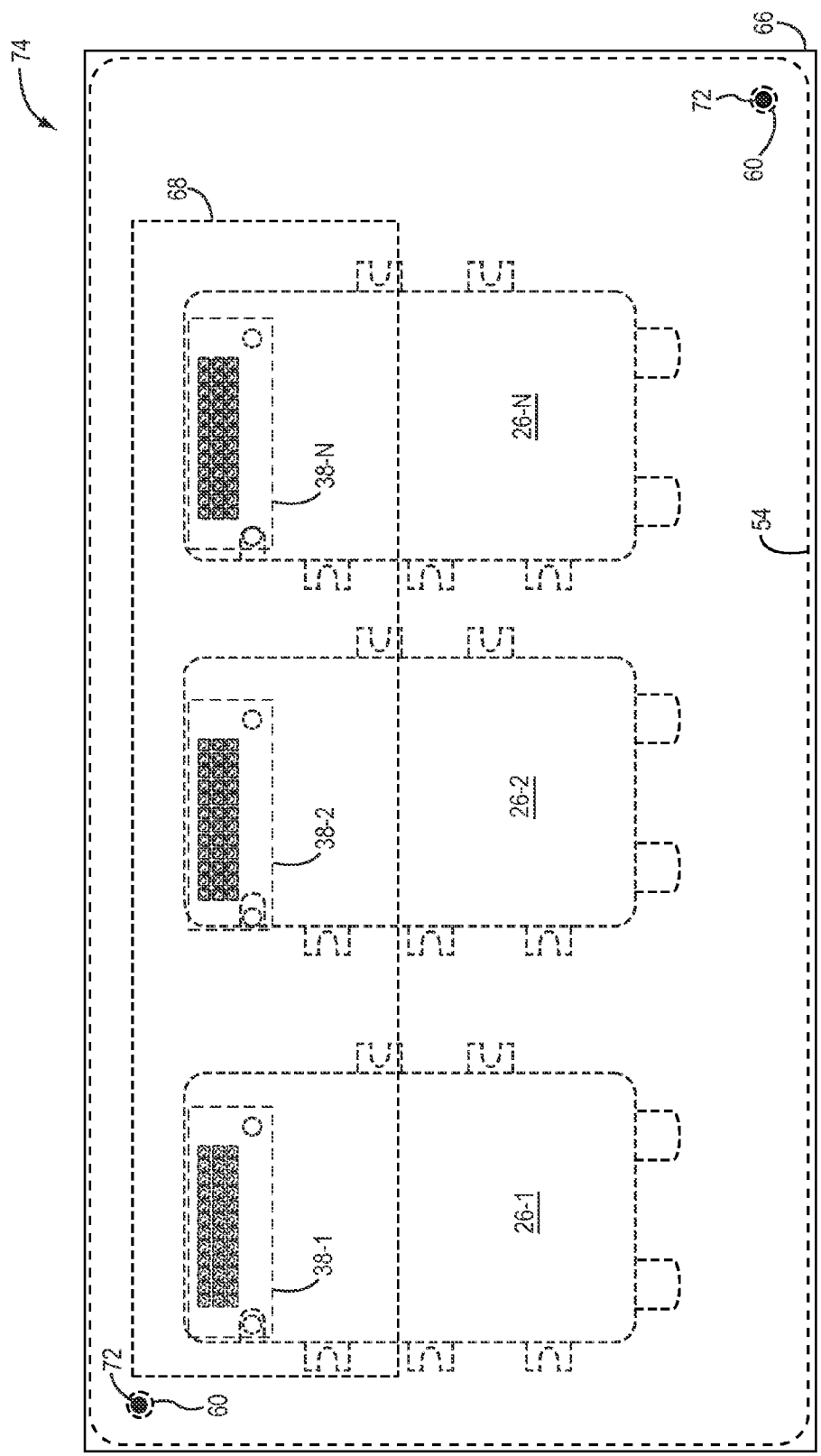
FIG. 14 is a block diagram illustrating a top view of a layered electronic assembly formed by placing a second layer electronic assembly illustrated in FIG. 12 over the mounting plate and subassemblies illustrated in FIG. 11.

FIG. 14 is a block diagram of a top view of a layered electronic assembly 74 formed by placing the second layer electronic assembly 66 illustrated in FIG. 12, over the mounting plate 54 and subassemblies 52 illustrated in FIG. 11. In this embodiment, the second anchor features 60 comprise pins that extend a distance above the surfaces of the electronic components 26. The pin receiving openings 72 of the second layer electronic assembly 66 are aligned with the second anchor features 60 and the second layer electronic assembly 66 is then slid down the second anchor features 60 such that the set 70 of contact pads contact the compression connectors 38 of the subassemblies 52. The pin receiving openings 72 are located at predetermined locations with respect to the sets 70 of contacts such that the sets 70 of contact pads are registered, or vertically aligned, with the sets 28 of contact pads of the electronic components 26, by virtue of the sets 28 of contact pads being registered to the first anchor features 56 via the reference openings 30.

Figure 15:
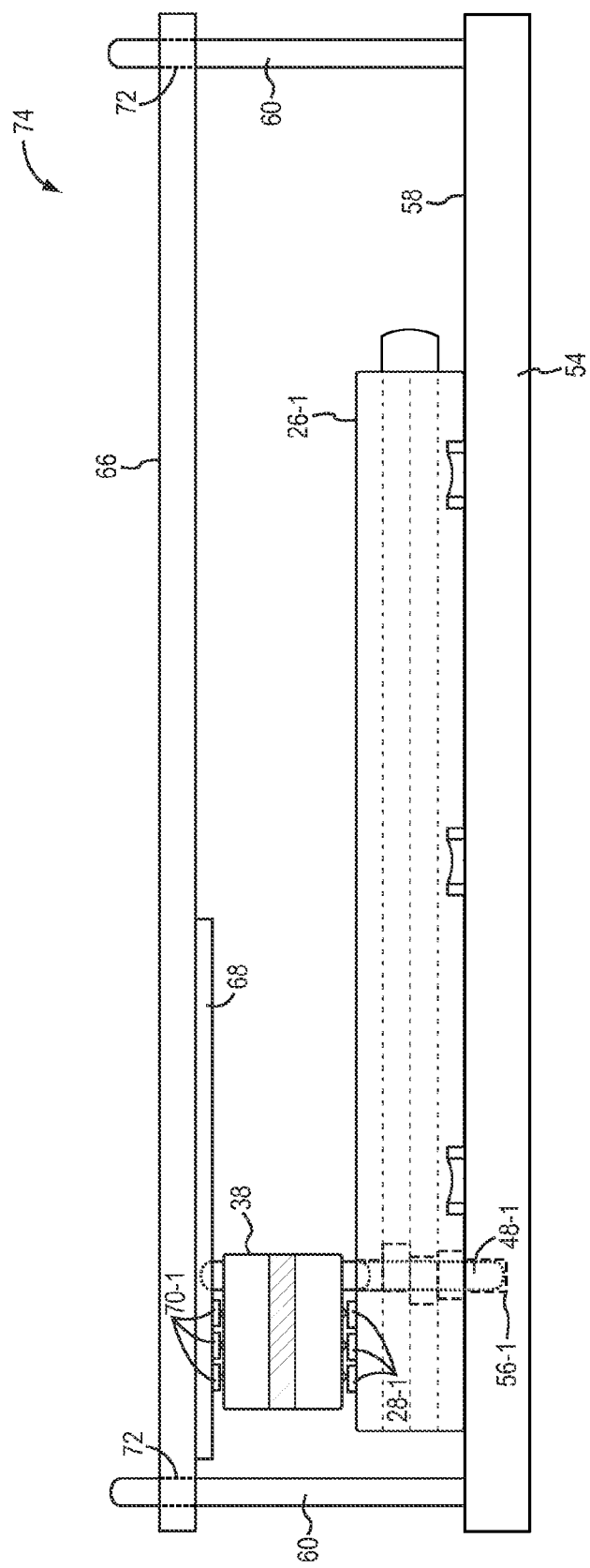
FIG. 15 is a block diagram illustrating a side view of a layered electronic assembly, according to one embodiment.

FIG. 15 is a block diagram of a side view illustrating the layered electronic assembly 74, according to one embodiment. As illustrated, the set 70-1 of contact pads of the electronic component 68 is vertically aligned with the set 28-1 of contact pads of the electronic component 26-1. Thus, the compression connector 38-1, by virtue of being aligned with the set 28-1 of contact pads via the pin 48-1 and the first anchor feature 56-1, need only be placed in between the set 28-1 of contact pads and the set 70-1 of contact pads to provide electrical paths between the electronic component 26-1 and the electronic component 68. No soldering is required.

Among other advantages, the present embodiments eliminate the need for a relatively expensive flexible interconnect circuit, eliminate the need to solder contacts, and facilitate simultaneous blind mating of multiple electronic components 26 to the second layer electronic assembly 66.

Figure 16:
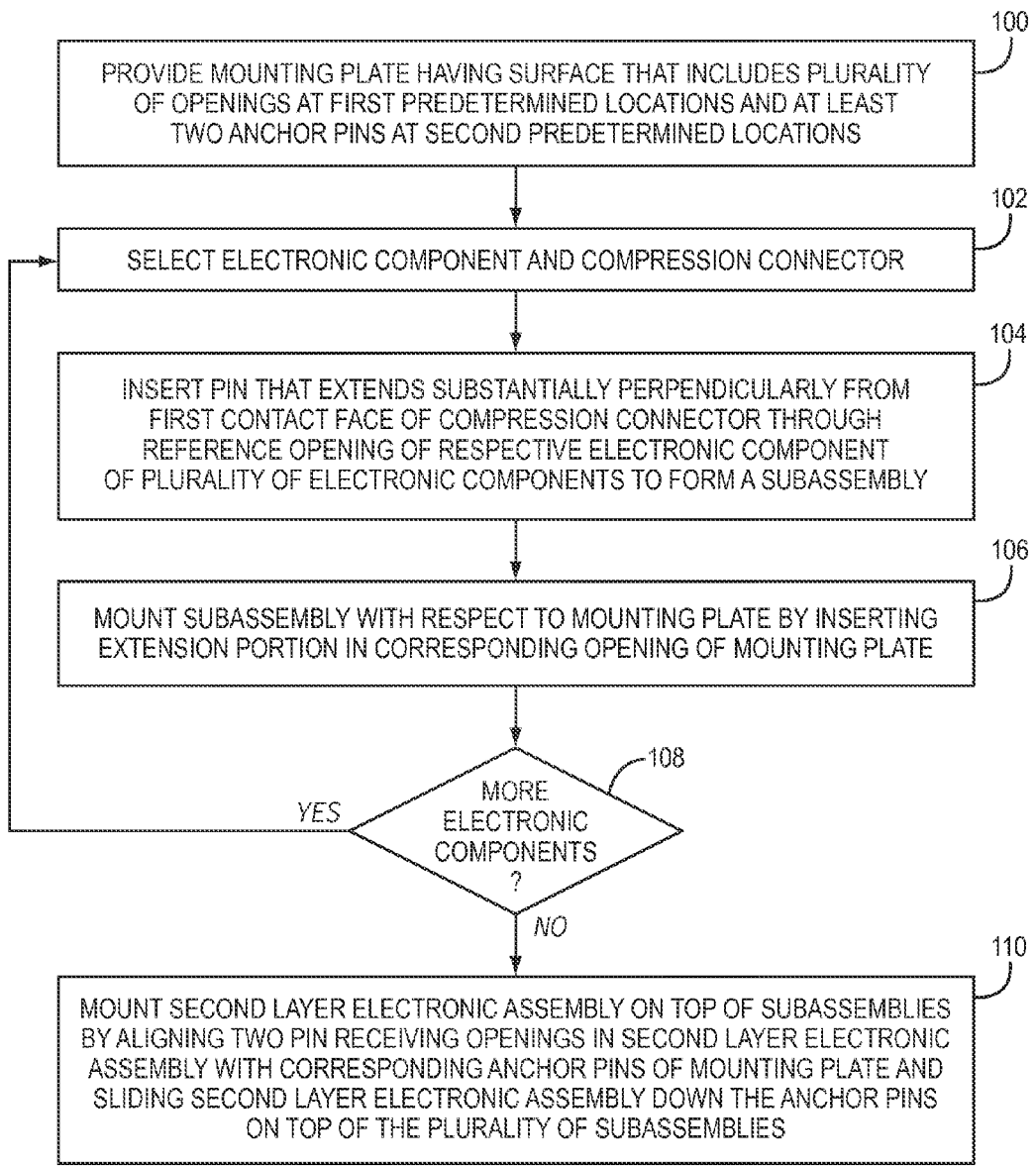
FIG. 16 is a flowchart of a method for assembling a layered electronic assembly, according to one embodiment.

FIG. 16 is a flowchart of a method for assembling a multiple layered electronic assembly, according to one embodiment. FIG. 16 will be discussed in conjunction with FIGS. 10-15. The mounting plate 54 having the surface 58 that includes the plurality of first anchor features 56 at first predetermined locations and the second anchor features 60 at second predetermined locations is provided (FIG. 16, block 100). In this embodiment, the first anchor features 56 comprise openings formed in the surface 58, and the second anchor features 60 comprise pins that extend from the surface 58. An electronic component 26 and compression connector 38 are selected (FIG. 16, block 102). The pin 48 of the compression connector 38 is inserted through the reference opening 30 of the electronic component 26 to form a subassembly 52 (FIG. 16, block 104). The subassembly 52 is mounted with respect to the surface 58 by inserting the portion of the pin 48 that extends beyond the surface of the electronic component 26 into a corresponding first anchor feature 56 (FIG. 16, block 106). The length of the pin 48 may differ depending on the particular application, but is preferably long enough to extend through the electronic component 26 and beyond the bottom surface of the electronic component 26 a sufficient distance to allow secure engagement with the first anchor feature 56. In some embodiments, the length of the portion of the pin 48 extending from the first contact face 40 of the compression connector 38 is in a range from about one-half of an inch to about three-fourths of an inch.

If more electronic components 26 are to be mounted on the surface 58 of the mounting plate 54, the process is repeated (FIG. 16, blocks 108, 102-106). After a desired number of electronic components 26 are mounted with respect to the surface 58 of the mounting plate 54, the second layer electronic assembly 66 is mounted on top of the subassemblies 52 by aligning the pin receiving openings 72 with the second anchor features 60 of the mounting plate 54 and sliding the second layer electronic assembly 66 down the second anchor features 60 on top of the subassemblies 52 (FIG. 16, block 110).

Those skilled in the art will recognize improvements and modifications to the preferred embodiments of the disclosure. All such improvements and modifications are considered within the scope of the concepts disclosed herein and the claims that follow.

What is claimed is:

1. A method of assembling a multiple layer electronic assembly, comprising:
  providing a mounting plate having a surface comprising:
    a plurality of anchor openings at first predetermined locations; and
    at least two anchor pins at second predetermined locations;
  for each of a plurality of first layer electronic components:
    inserting a pin that extends substantially perpendicularly from a first contact face of a compression connector through a reference opening of a respective first layer electronic component of the plurality of first layer electronic components to form a subassembly, the pin extending completely through the respective first layer electronic component and having an extension portion that extends beyond a bottom surface of the first layer electronic component; and
    mounting the subassembly with respect to the mounting plate by inserting the extension portion in a corresponding anchor opening of the mounting plate; and
  mounting a second layer electronic assembly on top of the subassemblies by aligning two pin receiving openings in the second layer electronic assembly with the corresponding at least two anchor pins of the mounting plate and sliding the second layer electronic assembly down the at least two anchor pins on top of the plurality of subassemblies.

2. The method of claim 1, wherein the second layer electronic assembly comprises a plurality of sets of electrical contacts, and wherein each set of electrical contacts is in electrical communication with one of the first layer electronic components.

3. The method of claim 1, wherein at least one first layer electronic component of the plurality of first layer electronic components comprises:
  a plurality of electrical contact pads arranged in a predetermined pattern on a top surface of a top layer of a plurality of layers of the at least one first layer electronic component; and
  the top layer forming the reference opening positioned in a predetermined location with respect to the plurality of electrical contact pads, wherein the reference opening is in communication with openings in each layer of the plurality of layers to collectively form a throughhole through the at least one first layer electronic component.

4. The method of claim 3, wherein the openings in each layer of the plurality of layers except the top layer have a larger diameter than the reference opening in the top layer.

5. The method of claim 4, wherein the at least one first layer electronic component comprises a co-fired ceramic electronic component.

6. The method of claim 1, wherein the first contact face comprises a first plurality of electrically conductive first compressible contacts, and wherein inserting the pin that extends substantially perpendicularly from the first contact face of the compression connector through the reference opening of the respective first layer electronic component aligns the first plurality of electrically conductive first compressible contacts with corresponding electrical contact pads of the respective first layer electronic component.

7. The method of claim 6, wherein the compression connector comprises a second contact face comprising a second plurality of electrically conductive second compressible contacts, at least some of the second compressible contacts in electrical communication with corresponding first compressible contacts, and wherein the second layer electronic assembly comprises at least one electronic component that comprises a plurality of contact pads, and wherein mounting the second layer electronic assembly on top of the plurality of subassemblies by aligning the two pin receiving openings in the second layer electronic assembly with the corresponding at least two anchor pins of the mounting plate and sliding the second layer electronic assembly down the at least two anchor pins on top of the plurality of subassemblies causes the second plurality of electrically conductive second compressible contacts to contact corresponding contact pads of the at least one electronic component.

* * * * *